United States Patent [19]

McClelland, III

[11] 4,034,292

[45] July 5, 1977

[54] DIRECTION SENSITIVE OPTO-ELECTRONIC PULSE INITIATOR FOR ELECTRICAL METERS

[75] Inventor: Theodore M. McClelland, III, Raleigh, N.C.

[73] Assignee: Westinghouse Electric Corporation, Pittsburgh, Pa.

[22] Filed: Feb. 18, 1976

[21] Appl. No.: 658,951

[52] U.S. Cl. .............................. 324/157; 250/233; 324/97; 324/137; 340/206

[51] Int. Cl.[2] ................. G01R 11/36; G01R 13/38; G01D 5/36; G08C 19/16

[58] Field of Search .............. 324/96, 97, 137, 157, 324/103 R; 250/233, 231 SE; 360/41; 340/201 P, 204, 206

[56] References Cited

UNITED STATES PATENTS

| | | | |
|---|---|---|---|
| 3,127,594 | 3/1964 | Roe et al. ...................... | 324/137 X |
| 3,311,824 | 3/1967 | Pitt ................................. | 324/103 R |
| 3,399,347 | 8/1968 | Martens ........................... | 324/96 |
| 3,733,493 | 5/1973 | McClelland ...................... | 250/233 |
| 3,878,391 | 4/1975 | McClelland et al. ............. | 250/233 |
| 3,943,498 | 3/1976 | McClelland et al. ............. | 360/41 X |

Primary Examiner—Gerard R. Strecker
Attorney, Agent, or Firm—D. R. Lackey

[57] ABSTRACT

An opto-electronic pulse initiator for producing meter data pulses from a meter having a rotating movement. A directionally oriented pattern containing at least two reflective surfaces is driven by the meter movement to sequentially activate first and second optical sensors. The sensors are activated in opposite sequences in response to opposite rotations of the meter movement. A solid state pulse initiating circuit is utilized and includes low power digital integrated circuit elements, including a clocked bistable logic circuit. The optical sensors are connected to the inputs of the bistable logic circuit to produce predetermined mutually opposite binary logic states at the outputs of the bistable circuit, with the logic states corresponding to a given direction of meter movement. Data pulse output channels are controlled by the bistable logic circuit to selectively produce meter data pulses for a predetermined direction of rotation of the meter movement.

6 Claims, 5 Drawing Figures

DIRECTION SENSITIVE OPTO-ELECTRONIC PULSE INITIATOR FOR ELECTRICAL METERS

BACKGROUND OF THE INVENTION

1. Field of the Invention:

This invention relates, in general, to pulse initiators for pulse operated metering systems and, more specifically, to opto-electronic pulse initiators which are responsive to the direction of rotation of the meter movement and which produce meter data pulses responsive to both the rate of meter movement and to the direction of meter movement.

2. Description of the Prior Art

Pulse initiators of the photoelectric or opto-electronic type are well known for use in electric utility metering systems. Such pulse initiators are typically associated with an integrating type meter, such as a watthour meter, to generate meter data pulses responsive to the rate of rotation of the watthour meter movement, which normally includes a rotating shaft and disc. Such opto-electronic pulse initiators are disclosed and claimed in U.S. Pat. No. 3,733,493, U.S. Pat. No. 3,878,391, and U.S. Pat. No. 3,943,498, all of which are assigned to the assignee of this invention. The opto-electronic pulse initiators described in these references are mounted to a meter and include a reflective pattern which is rotated by the meter movement. Basically, an optical sensing unit includes solid state radiation sensors for producing pulses as the reflecting surfaces of the pattern pass generally between the sensors and light emitting devices.

Although meters, such as watthour meters, are generally operated in one direction of meter movement, the pulse initiators described hereinabove respond to the rotational movement of the reflective pattern without respect to the direction of the movement of the pattern. Accordingly, the meter data pulses produced by occasional opposite directions of meter movement rotation are not distinguishable. Watthour meters are often provided with mechanical detent arrangements for preventing reverse rotation of the meter shaft and disc. This prevents reverse rotation of a pattern arrangement provided directly on the meter disc and prevents the dial registers of the meter from being operated in a down-scale direction. Other mechanical detent arrangements are also provided in other types of pulse initiators having a separate mechanism which is driven from the meter shaft by a gearing arrangement. The detent arrangements assure that the meter data pulses will be produced only in accordance with one direction of rotation of the pattern. The mechanical detents are also intended to prevent "creep" and small osciallating conditions occurring when the power consumption being measured by the meter is very low or zero.

Since many of the detent mechanisms include a ratchet wheel and pawl, some reverse rotation of the meter movement or gear train system can occur before locking engagement between the pawl and one of the ratchet teeth is accomplished. It has also been noted that in certain pulse initiator systems, the edges of the reflective surfaces may be positioned adjacent to the sensing unit in a stop or rest condition of the meter. Slight creeping or osciallating movement of the pattern relative to the sensing unit has also been noted to occur with the meter substantially stopped. Any one of these conditions can produce "false" pulses which erroneously indicate rotation of the meter movement.

In certain electric power metering systems, it is desirable to measure consumption of power which may flow in either of two directions. As one example, electrical energy can flow in opposite directions in a given set of conductors used for power exchange between electric utility companies. Pulse metering of bi-directional electrical energy can be provided by the prior art pulse initiators of the type disclosed hereinabove by using two meters which are equipped with pulse initiators that are arranged to operate only in opposite directions. Accordingly, one pulse initiator produces pulses indicating a measured electrical energy flow in one direction and the other pulse initiator produces pulses indicating the energy flow in the opposite direction. This is necessary since the pulse initiators are arranged to have only a single output and register power flowing in only one direction.

Therefore, it is desirable, and it is an object of this invention, to provide a pulse initiator system which is compatible with existing pulse initiator systems and which is capable of indicating the direction of power flow as well as the rate of power flow.

SUMMARY OF THE INVENTION

There is disclosed herein a new and useful direction sensitive opto-electronic pulse initiator for electric meters which are used with pulse metering systems. The pulse initiator includes a pattern having reflecting surfaces for indicating the rate of rotation as well as the direction of rotation of the meter movement. First and second optical sensors are sequentially activated by two reflecting surfaces in either of two sequences depending upon the direction that the pattern is driven by the meter movement.

The radiation sensors are connected to independent solid state pulse initiating circuits, including clocked bistable logic circuits. Each bistable circuit has two complementary Q and $\overline{Q}$ digital outputs for controlling first and second output channels provided in an output circuit of the pulse initiating circuit. The sensors are connected to independent bistable circuits and are connected to a clock control input of both bistable circuits. The initially activated optical sensor provides an impulse which conditions the bistable circuit and establishes the binary state of the digital outputs so as to selectively control the output channels in accordance with the direction of rotation of the meter movement.

In one preferred embodiment of the pulse initiator, a second pattern and a second optical sensing unit having third and fourth radiation detectors are provided for exclusively indicating the rate of meter movement. Controlled switch circuits are included which have signal and control inputs and signal outputs, with the latter connected to the first and second output channels of the pulse initiating circuit. The signal inputs are connected to the radiation detectors of the second optical sensing unit. The control inputs of the switch circuits are connected to the digital outputs of the bistable circuit which are established at either of the opposite binary states in response to the sequence that the conditioning inputs are received from the first and second detector impulses. Depending upon the binary state of the bistable digital outputs, the controlled switches are conditioned so that one of the output channels is effective to produce meter data pulses in response to the particular direction of rotation of the meter movement at a rate detected by the second sensing unit.

In a second preferred embodiment of the pulse initiator of this invention, only one optical sensing unit and a second form of clocked bistable logic circuit is necessary. A resetting control circuit is included to reset outputs of the bistable logic circuit. The bistable circuit is triggered and reset during the interval in which each set of the staggered reflecting surfaces passes the one sensing unit to produce two sensor impulses. The bistable circuit is operated from one state to the second state and then returned to the first state. Either one of the two sets of bistable digital outputs will produce pulses depending upon the direction of meter rotation and the pulses will be produced at a rate which supplies the metering information. Thus, the meter data pulses are produced directly from the bistable outputs.

The outputs of the low power solid state circuits are connectable to high power transistors or other solid state switching or pulse amplifying output circuitry. Accordingly, the pulse initiating output channels produce the required current levels for desired telemetry transmission and pulse recording or receiving equipment.

BRIEF DESCRIPTION OF THE DRAWING

Further advantages and uses of this invention will become more apparent when considered in view of the following detailed description and drawing, in which.

DESCRIPTION OF THE PREFERRED EMBODIMENTS

Figure 1:
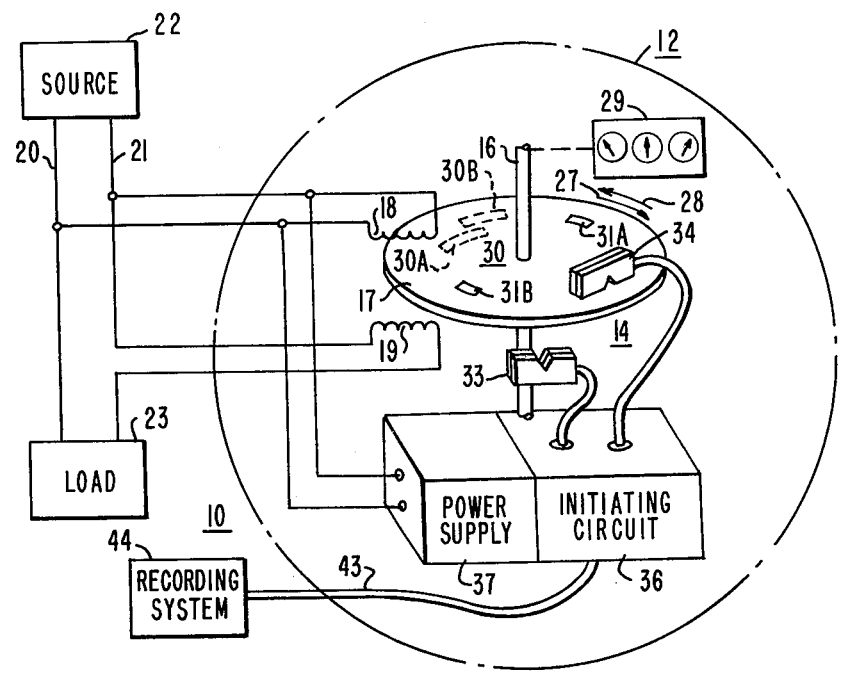
FIG. 1 is a view of a watthour meter constructed with opto-electronic sensors positioned for detection of the direction and rate of meter movement according to this invention.

Throughout the following description, similar reference characters refer to similar elements or members in all of the FIGURES of the drawing.

Referring now to the drawing, and to FIG. 1 in particular, there is shown a pulse metering telemetry system 10 which includes a watthour meter 12 having a direction sensitive opto-electronic pulse initiator 14 mounted therein which is made in accordance with the present invention. The watthour meter 12 is a well known integrating type used by electric utility companies for measuring electrical energy. The meter 12 includes an electro-responsive meter movement comprising a rotatable shaft 16 which carries an electro-conductive disc 17. The meter further includes a measuring circuit comprising at least one potential coil 18 and one current coil 19.

For further purposes of describing the present invention, the meter 12 of the metering system 10 is shown connected to the line conductors 20 and 21. The electrical supply source 22 and the load 23 are connected together by the conductrs 20 and 21. The source and load can be mutually interchanged so that electrical energy can be considered as flowing in either direction in the conductors 20 and 21. An application of electrical energy flow in both directions occurs, for example, at transmission line transfer sites which interconnect two or more electric utility power supply systems. In one aspect of this invention, it is contemplated that the present invention can be used advantageously in systems which measure electrical energy flow in a single direction as will be discussed hereinafter.

The potential coil 18 and the current coil 19 are suitably connected to the line conductors 20 and 21 for measuring the electrical energy flow therein. Energization of the coils 18 and 19 electromagnetically drives the disc 17 in accordance with the well known operation of conventional watthour meters. The disc 17 has a predetermined rate of rotation corresponding to the rate electrical energy flows through the electrical conductors 20 and 21. The power disc 17 will be driven in opposite directions corresponding to opposite directions of electrical energy flow. For example, the disc 17 may rotate in clockwise and counterclockwise directions, as indicated by the directional arrows 27 and 28, respectively.

A dial register 29 is usually coupled to the shaft 16 in conventional watthour meters to mechanically accumulate and indicate the revolutions of the shaft 16 and the disc 17 in a manner calibrated to register in kilowatt hours. The register 29 can be of either a type which is driven up-scale in response to the disc revolutions in one direction or in response to disc revolutions in both directions. Although a register equipped meter is not required to practice this invention, it is emphasized that the pulse initiator 14 of the present invention may be used with a meter having either one of the previously mentioned types of registers.

According to one aspect of this invention, the pulse initiator 14 is exclusively responsive to a single direction of rotation of the disc 17. Thus, the pulse initiator 14 will avoid the necessity of the inclusion of a mechanical detent arrangement in the meter 12 that typically includes a ratchet wheel and pawl arrangement between the shaft 16 and the register 29, or between the shaft 16 and a separate rotating pattern which is driven by the shaft 16.

The pulse initiator 14 generally includes a first and directionally oriented pattern 30 whch includes staggered reflecting surfaces 30A and 30B which partially overlap each other on the bottom of the disc 17. A second pattern includes reflecting surfaces 31A and 31B circumferentially spaced on the top of the disc 17 in a manner known to those skilled in the art, such as shown in U.S. Pat. No. 3,733,493. The surfaces of both of the reflecting patterns contain reflecting surfaces which are surrounded by nonreflecting areas. As noted hereinabove, either or both of the patterns may be provided on an auxiliary rotating member driven by a system geared to the shaft 16. The reflective pattern 30 provides directional information for indicating not only the rotational rate of the meter movement, but also the direction of the rotational movement. The reflective pattern comprising the reflective surfaces 31A and 31B is symmetrically disposed on the upper portion of the disc 17 and is used in one embodiment for indicating the rotational rate of the meter movement as described in the aforementioned U.S. Pat. No. 3,733,493. This pattern, and an associated arrangement for detecting the pattern, is included in the embodiment of this invention illustrated in FIG. 3, but is not required in the embodiment illustrated in FIG. 4.

The pulse initiator 14 further includes optical sensing units 33 and 34 which detect the rotation of the reflecting patterns. The sensing unit 33 is positioned below the disc 17 and the sensing unit 34 is positioned above the disc 17. The sensing units 33 and 34 are substantially identical to the sensing units disclosed in U.S. Pat. No. 3,943,498. Radiation or photoelectric elements are arranged so that separate impulses are produced in response to a passing of the reflecting surfaces across the associated sensing unit.

The pulse initiator 14 further includes a solid state pulse initiating circuit 36 and a power supply 37. The output channels of the pulse initiating circuit 36 are connected to the recording system 44 by the cable 43. Meter data pulses are transferred by the cable 43 to the recording system 44 in accordance with the direction of rotation of the disc 17 and the rate of rotation the meter movement. The pulse rate is proportional to the rate of rotation of the disc 17, which is in accordance with the amount of the electric energy measured by the meter 12. The recording system 44 of the telemetry system 10 is responsive to pulses to produce totalizing, indicating, recording or other data processing operations, depending upon its intended function. In one preferred use of the present invention, the recording system 44 may be a magnetic data pulse recorder which is coupled to the initiating circuitry in the watthour meter. It is also within the scope of this invention that the recording system 44 may be such that it transfers pulses to a remote location over wire or radio facilities.

The pulse initiating circuit 36 and the power supply circuit 37 may be provided on a common circuit board mounted to the frame of the watthour meter as disclosed in U.S. Pat. No. 3,943,498. The power supply 37 may include a step-down transformer connected to the measured electrical conductors 20 and 21 and may further include rectifier and voltage regulating elements.

The optical sensing units 33 and 34 are suitably mounted for positioning adjacent to the patterns of reflecting surfaces. At least one of the sensing units may be mounted on the circuit board containing the pulse initiating circuit 36 and the power supply 37 in a manner somewhat similar to that shown and described for the sensing unit described in U.S. Pat. No. 3,943,498.

Figure 2:
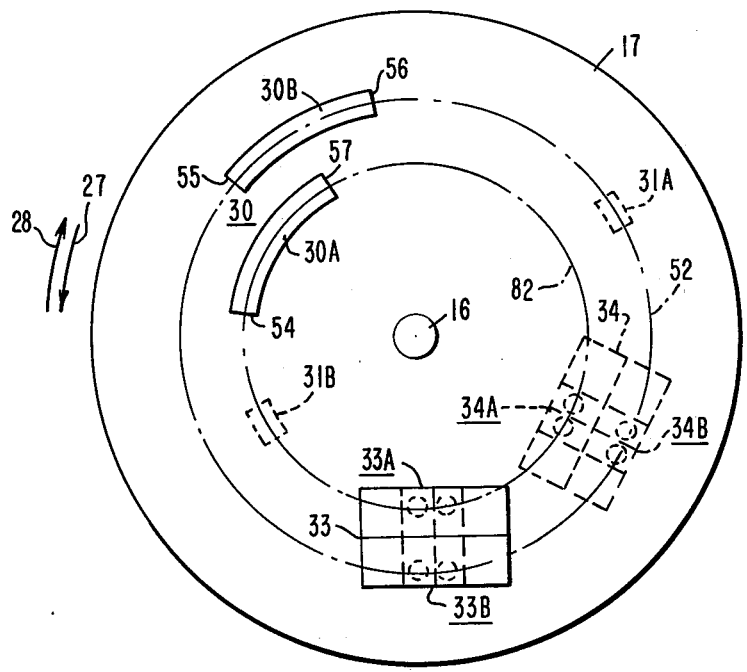
FIG. 2 is a bottom view of the meter disc shown in the watthour meter of FIG. 1.
Figure 3:
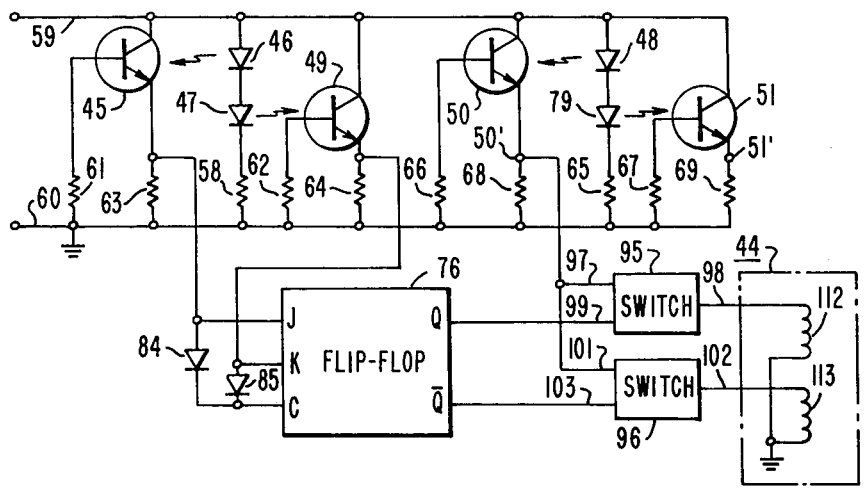
FIG. 3 is a schematic diagram of the initiating circuit shown in FIG. 1 constructed according to one embodiment of this invention.

Referring now to FIG. 2, there is shown an enlarged view of the directionally oriented pattern 30 and of a nondirectional pattern. The orientation of the sensing units 33 and 34 with respect to the pattern travel is also generally illustrated. The sensing units 33 and 34 are substantially identical, with the unit 33 including first and second radiation emitter and sensor pairs 33A and 33B and the sensing unit 34 similarly including third and fourth radiation emitter and sensor pairs 34A and 34B. The radiation emitters and radiation sensors are formed by solid state devices which are connected to the pulse initiating circuit 36 as shown in FIG. 3. Each of these sensors are activated by radiation reflected from reflecting surfaces on the disc 17.

In FIG. 2, the bottom of the disc 17 is shown with the pattern 30, including reflecting surfaces 30A and 30B, illustrated on the exposed side of the disc 17. The area of the disc 17 surrounding the reflecting surfaces 30A and 30B is not reflective. The segment 30A and extends in a circular arc along a circular axis 82. The radiation emitter and sensor pairs 33A and 34A are aligned immediately above the circular axis 82. The surface 30B extends in a circular arc around the circular axis 52, above which axis the radiation emitter and sensor pairs 33B and 34B are aligned.

The surfaces 30A and 30B have substantially identical lengths along the axes 82 and 52 and are staggered so as to have an end portion of each surface overlapping each other. The surface 30A has an end 54 which extends further in a counterclockwise direction than the end 55 of surface 30B. The clockwise end 56 of the surface 30B extends further in a clockwise direction than does the end 57 of the surface 30A. Accordingly, as the disc 17 rotates in the direction of the arrow 27, the end 54 will first activate the radiation sensor pair 33A due to reflections from the surface 30A. The radiation sensor pair 33B will be activated thereafter as the edge 55 of the surface 30B passes beneath the radiation emitter and sensor pair 33B. Both of the sensor pairs will remain activated until the end 57 of the surface 30A passes beyond the sensor pair 33A. Therefore, the sensor pair 33A is deactivated while the sensor pair 33B remains activated until the end 56 of the surface 30B passes beneath the sensor pair 33B.

When the disc 17 is rotating in the direction indicated by the arrow 28, the reverse of the sequence just described will occur. That is, the sensor pair 33B will be initially activated and thereafter the sensor pair 33A will be activated coincidentally with the sensor pair 33B, and then the sensor pair 33B will be deactivated while the sensor pair 33A remains activated until the end 54 of the surface 30A is rotated from underneath the sensor pair 33A.

The reflecting surfaces 31A and 31B are disposed diametrically opposite each other and substantially equal distances from the end 54 of the surface 30A and the end 56 of the surface 30B. The sensor pairs 34A and 34B included in the sensing unit 34 are aligned with the axes 82 and 52 so that the surfaces 31A and 31B alternately activate the sensors during a complete revolution of the disc 17. This operation corresponds substantially identically to the operation of the reflecting surfaces or indicia disclosed in U.S. Pat. No. 3,733,493.

Referring now to FIG. 3, there is shown an electrical schematic diagram of one preferred embodiment of a pulse initiating circuit represented by the circuit block 36 shown in FIG. 1 and constructed in accordance with the present invention. The circuits of the optical sensing units 33 and 34 are also shown. The circuits of the first and second optical sensing units 33 and 34 and of the power supply 37 are substantially as described for the optical sensing unit and power supply in U.S. Pat. No. 3,943,498.

The radiation emitters 46 and 47 and sensors 45 and 49 include light emitting diodes and phototransistors. As described in the aforementioned reference, the light emitting diode emitters 46 and 47 are connected in series with each other and with the resistor 58. The combination is connected across a positive voltage supply conductor 59 and a ground reference supply conductor 60 which would be connected to the power supply 37. The electrodes of the phototransistors 45 and 49 are connected as shown wherein base resistors 61 and 62 are provided and emitter connected resistors 63 and 64 are provided. Similarly, the emitters 48 and 79 are connected in series with the resistor 65 and across the supply conductors 59 and 60, and the sensors 50 and 51 have base connected resistors 66 and 67, respectively, and emitter connected resistors 68 and 69, respectively. The portion of the circuit associated with phototransistor 51 is not used in this embodiment but is illustrated to indicate how the present invention may be applied to circuits described in previous patents.

A clocked bistable logic circuit formed by a J-K type flip-flop 76, with set and reset capability which is not used, is connected through diodes 84 and 85 to the resistors 63 and 64. The J and K inputs condition the flip-flop circuit for establishing either of the two bistable circuit states. Binary logic 1 or 0 outputs are produced at the complementary Q and $\bar{Q}$ outputs in accordance with the bistable state. The flip-flop 76 is toggled between the two states upon a low-to-high transition at the clock input C if the bistable state is to be changed. The J input is connected so as to receive a positive sensor impulse which is developed across the resistor 63 when the sensor 45 is activated. The k is connected to receive a positive impulse when the sensor 49 is rendered conductive.

A sensor positive going impulse on eight of the J or K inputs is applied simultaneously to the clock input C. The diodes 84 and 85 prevent an impulse applied to one of the inputs from being applied to the other input. The flip-flop 76 is operative such that the impulse applied to the clock input is delayed within the internal circuitry of the flip-flop so that simultaneously applied impulses at the clocked and J or K inputs will be effective in toggling the circuit when a change in the bistable state of the flip-flop is to be accomplished. The set and reset inputs, which are not shown, may be tied to a grounded conductor to avoid undesired circuit operation due to transient signals. A flip-flop provided in an RCA type CD-4027A integrated circuit may be used for the flip-flop 76.

The arrangement of the pulse initiating circuit 36 as described above will produce the opposite or complementary binary logic state at the Q and $\bar{Q}$ outputs so as to indicate or represent either of the two directions of rotation of the disc 17. Accordingly, when the meter disc 17 is moving in the direction indicated by the arrow 27, the Q output will be high or at the one logic state and the $\bar{Q}$ output will be at the low or zero logic state. Consequently, when the meter disc is rotating in the direction of the arrow 28, the $\bar{Q}$ output will be at the one logic state and the Q output will be at the zero logic state. As will be described in more detail hereinafter, the Q and $\bar{Q}$ outputs will continuously remain at the same binary logic state for a given direction or rotation and will reverse logic states only when the rotation of the disc 17 changes.

Bilateral control switches 95 and 96, which are available in an RCA type CD-4016 integrated circuit, are connected to the Q and $\bar{Q}$ outputs of the flip-flop 76 and also to the phototransistor 50. The control switch 95 includes a signal input line 97, a signal output line 98, and a switch enabling control line 99. Similarly, the control switch 96 includes a signal input line 101, a signal output line 102, and a switch enabling control line 103. When the control lines 99 and 103 are at a positive voltage or at the one logic state, the control switches 95 and 96 are turned on so as to transfer the voltage condition existing at the inputs 97 and 101 to the signal outputs 98 and 102, respectively. The voltages are applied to the recording system 44 which, in this specific embodiment, includes magnetic tape recording heads 112 and 113.

During the operation of the pulse initiating circuit 36 shown in FIG. 3, a rotation of the disc 17 in the direction of the arrow 27 as shown in FIGS. 1 and 2 moves the staggered surfaces 30A and 30B across the sensing unit 33 to sequentially activate the phototransistor sensors 45 and 49. A positive voltage impulse is first applied to the J input of the flip-flop 76. Concurrently, the positive impulse will be applied to the clocked input of the flip-flop 76. The positive going transition into the clocked input will provide a logic one state on the Q output of the flip-flop 76 if it is not already in the high state. Accordingly, the $\bar{Q}$ output will remain in the low or zero logic state. This will provide a turn-on of the control switch 95 and the control switch 96 will remain in the turned off condition. When the phototransistor sensor 49 is activated, an impulse occurs at the K input and concurrently at the clocked input C. Since the clocked input will already be at the logic one state, there will be no transition at the clocked input due to the overlapping relationship of the reflecting surfaces 30A and 30B. The flip-flop 76 will remain in this state as long as the disc 17 continues to rotate in the direction of arrow 27. This maintains the control switch 95 enabled or in the turned on condition so that the output of the pulse initating circuit 36 is operative to produce meter data pulses at head 112.

To produce the meter data pulses, the surfaces 31A and 31B pass across the sensing unit 34 and the phototransistor sensors 50 and 51 are activated by the reflected radiations from the radiation emitters 48 and 79, respectively. Positive voltage impulses will be applied to the control switches 95 and 96 at the input lines 97 and 101. These impulses will only pass through the control switch 95 to the signal output line 98. This produces meter data pulses at the recording head 112. Alternately, a single radiation emitter and sensor pair can be used in the sensing unit 34 and one or more surfaces can be positioned on a common circular axis aligned with the sensor pair to indicate the rate of rotation of the disc 17. However, it is preferred to use standard sensing units 33 and 34, each having two radiation emitter and sensor pairs, to provide greater flexibility. One advantage of this flexibility is to control the number of impulses that can be produced with each revolution of the meter disc.

When the disc 17 rotates in the direction represented by the directional arrow 28, the segment 30B will pass under the sensing unit 33 before the segment 30A passes thereunder. As the flip-flop 76 is in the bistable state described above, an impulse is applied by activation of the sensor 49 to the K input and to the clocked input so as to toggle the flip-flop 76 to assume a second bistable condition that is opposite to the other bistable condition. Thus, a high output or logic one is produced at the $\bar{Q}$ output and a low output or logic zero is produced at the Q output. This will enable the control switch 96 so that it is in the turned on condition and the control switch 95 will be turned off. The impulses applied to the signal input line 101 will pass through the switch 96 to the signal output line 102 and will appear at the recording head 113. The flip-flop 76 will remain in this bistable condition as long as the disc 17 continues to rotate in the direction indicated by the arrow 28. Accordingly, meter data pulses are produced at either the output recording head 112 or at the output recording head 113, as determined by the direction of rotation of the disc 17. If it is desired to measure the quantity of electrical power flowing in one direction only, only one of the output channels is used. Any movement of the disc 17 opposite to that of the metering direction will not produce a metering data pulse in the output channel being used in accordance with the description contained herein.

Figure 4:
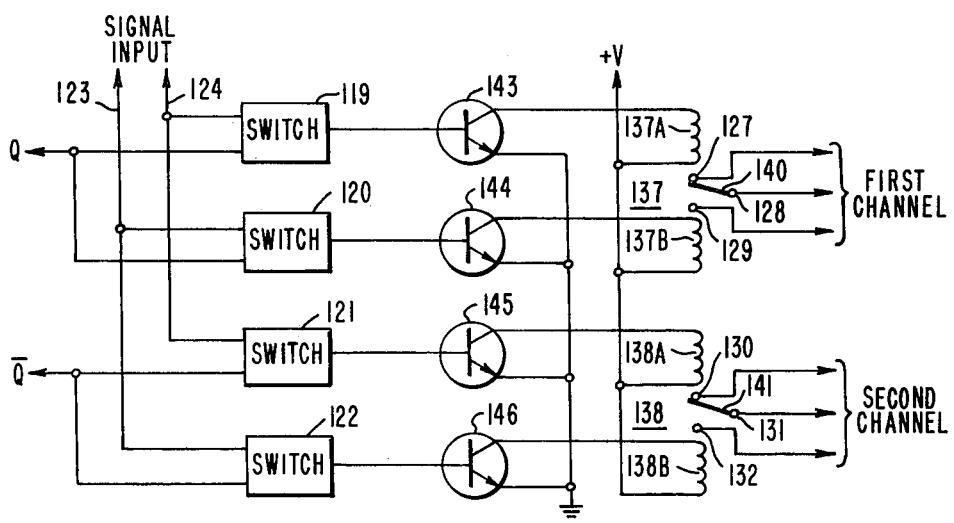
FIG. 4 is a schematic diagram of a modification which may be utilized in the circuit diagram of FIG. 3.

FIG. 4 shows an output circuit which may be an alternative to the output circuit of the pulse initiating circuit 36 shown in FIG. 3. The output circuit in FIG. 4 provides a three-wire telemetry system which is well known in the art of electric utility pulse metering systems. The signal input lines to the switches 120 and 122 are connected exclusively to the conductor 123 which would be connected to terminal 50' of the phototransistor 50 shown in FIG. 3. The signal input lines to the switches 119 and 121 are connected exclusively to the conductor 124 which would be connected to terminal 51' of the phototransistor 51. The control inputs of the switches 119 and 120 would be connected together into the Q output of the flip-flop 76. Thus connected, the switches 119 and 120 are associated with one output channel of the output circuit as will be described further herein.

The output circuit further includes two three-wire channel outputs, one being defined by one group of three-wire terminals 127, 128 and 129, and the second output channel being defined by a second group of three output terminals 130, 131 and 132. Relays 137 and 138 are included in the output circuit, with the relays having switch operating coils 137A, 137B, 138A and 138B. Amplifying NPN type transistors 143, 144, 145 and 146 are connected so that the relays are connected at the collectors thereof. The signal outputs from the control switches 119, 120, 121 and 122 are connected to the bases of the transistors 143, 144, 145 and 146, respectively.

During the operation of the output circuit of FIG. 4, a given direction of rotation of the disc 17 establishes either the logic one or zero state at the Q output or the logic one or zero state at the $\overline{Q}$ output of the flip-flop 76. The positive voltage producing the binary logic one output of the flip-flop 76 turns on either both of the switches 119 and 120 or both of the switches 121 and 122. When the Q output has a logic one state, the output channel is enabled so that the alternative activation of the radiation sensors 50 and 51 will alternately produce impulses through the switches 119 and 120 while the disc 17 rotates in the direction of the arrow 27. This will alternately trigger the transistors 143 and 144 which are connected to alternately energize the relay coils 137A and 137B. A short interval on the radiation impulse outputs will alternately latch the switch arm 140 in either the upper or lower position so as to provide alternate switch closure outputs at the output channel terminals 127, 128 and 129. The operation described herein provides three-wire telemetry transmissions as known in the prior art and produces the non-return-to-zero (NRZ) type of magnetic data recording.

Similar operation is provided at the other output channel terminals 130, 131 and 132 when the flip-flop $\overline{Q}$ output is at the logic one state and the Q output is at the logic zero state in response to a reverse direction of rotation of the meter disc 17 as indicated by the arrow 28. The switches 119 and 120 will be turned off and the switches 121 and 122 will be turned on. Thus, the transistors 145 and 146 will be rendered alternately conductive to energize relay coils 138A and 138B, and alternately latch the switch arm 141 across either of the switch terminals 130 or 132 to provided switch closure outputs at the terminals of the second output channel. These switch closures produce desired meter data pulses in the receiver connected to the other end of the telemetry channel conductors shown in FIG. 4.

Figure 5:
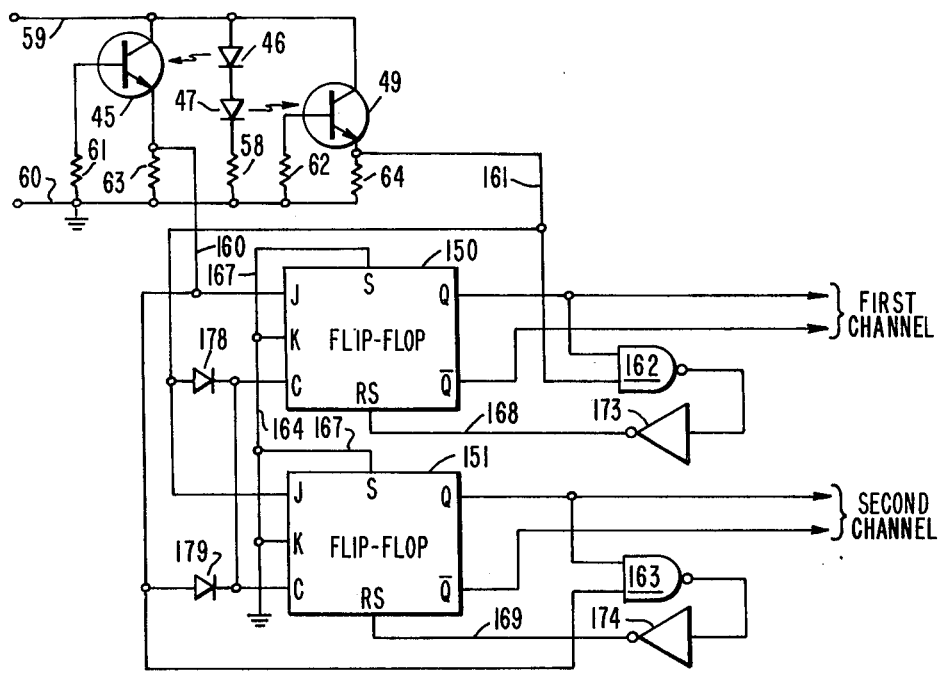
FIG. 5 is a schematic diagram of the initiating circuit shown in FIG. 1 constructed according to another embodiment of this invention.

Referring now to FIG. 5, there is shown a second embodiment of a pulse initiating circuit for a direction sensitive opto-electronic pulse initiator constructed in accordance with the present invention. Only the first optical sensing unit 33, as shown in FIG. 1, is utilized with the pulse initiating circuit constructed according to this embodiment. The operation is the same for the sensing unit 33 as described in connection with FIG. 3 and the sensing circuit elements shown in FIG. 5 are identified by the same corresponding reference numeral shown in FIG. 3.

The clocked bistable elements 150 and 151 are of the same type used in the circuit shown in FIG. 3. The set inputs 167 and the reset inputs 168 and 169 are utilized in this embodiment. The Q and $\overline{Q}$ outputs provide the complementary binary logic one and zero outputs as explained for the flip-flop 76. The Q and $\overline{Q}$ outputs of the flip-flop 150 produce the meter data pulses at the first output channel of the pulse initiating circuit and the Q and $\overline{Q}$ outputs of the flip-flop 151 produce the meter data pulses at the second output channel.

The output from the sensing unit 33, which is transmitted by conductor 161, is transmitted to the input of the NAND gate 162 and to the J input of the flip-flop 151. The sensing unit output conductor 160 is connected to both the NAND gate 163 and to the flip-flop 150. Diodes 178 and 179 have the anode of each connected to the conductors 161 and 160, respectively, and the cathode of each connected together and to the flip-flop clocked inputs. The K flip-flop inputs are connected to the ground reference supply conductor 164 so that they are constantly held at the zero logic state. The flip-flop set inputs 167 are also each connected to the grounded supply conductor 164. The flip-flop outputs Q and $\overline{Q}$ are separately connected to the NAND gate inputs as illustrated. The NAND gates 162 and 163 are connected through the inverters 173 and 174 to the reset inputs of the flip-flops 150 and 151, respectively.

During operation of the pulse initiating circuits shown in FIG. 5, the reflecting pattern 30 provides not only directional information, but also the metering pulse rate information which is proportional to the rate of rotation of the watthour meter disc 17 shown in FIG. 1. The outer edges 54 or 56 of the segments 30A and 30B, as shown in FIG. 2, activate one of the sensors to develop an impulse that is applied to the flip-flop 150 or 151, depending upon the direction of rotation of the disc 17. This impulse will toggle the flip-flops to an opposite bistable circuit state. The next or subsequently activated sensor of the sensing unit 33 is activated by either of the surface ends 55 or 57, depending upon the direction of disc rotation, to apply a pulse from the sensing circuit which resets the toggled flip-flop and returns it to the initial bistable circuit state. This produces a short pulse at the Q or $\overline{Q}$ output of the flip-flop.

For example, if the disc 17 shown in FIG. 2 is rotated in the direction of the arrow 27, the end 54 of the surface 30A will cause the sensor pair 33A to produce an impulse at the J input of the flip-flop 150 and at the clocked input of the flip-flop 151. This will produce a positive or logic one pulse at the Q output of the flip-flop 150 and a low or logic zero pulse at the $\overline{Q}$ output. The impulse transferred from the Q output to the input of the gate 162 does not change the output of the gate 162 since the other data input of this gate is held low by the logic zero state of the output provided by the conductor 161 when the phototransistor 49 is not turned on. When the end 55 of the pattern surface 30B activates the sensor pair 33B, the impulse applied to the J input of the flip-flop 151 does not toggle or affect the bistable state of the flip-flop 151 since the clocked input C is already high. Thus, there is no low-to-high transition to toggle the flip-flop 151.

The logic one state developed at the inputs of the gate 162 are passed through the gate 162 since both inputs are now high. This pulse is inverted by the inverter 173 to produce a logic one which resets the flip-flop 150. This returns the Q and $\overline{Q}$ outputs of the flip-flop 150 to the logic zero and one states, respectively. Accordingly, a meter data pulse is produced at the first channel which has a duration determined by the time intervaal required for the end 54 of the surface 30A and the end 55 of the surface 30B to pass the sensing unit 33. The previously described operation will be repeated each time the surfaces 30A and 30B pass the sensing unit 33 as the disc 17 is rotated in the direction of the arrow 27. The output channel is provided with two output lines, one which goes high during a pulse and one which goes low during a pulse.

The opposite direction of rotation of the disc 17 indicated by the directional arrow 28 will produce the corresponding operation of the flip-flop 151 as just described for the flip-flop 150. The flip-flop 151 will be toggled to produce the one and zero logic states at its Q and $\overline{Q}$ outputs upon the end 56 initially passing the sensing unit 33 and activating the sensor pair 33B. This will initiate a meter data pulse at the second output channel. The end 57 of the surface 30A will subsequently cause the sensor pair 33A to initiate a pulse through the gate 163 to reset the flip-flop 151. This will return the Q and $\overline{Q}$ outputs of the flip-flop 151 to the logic zero and one states, respectively.

It is to be noted that, if the meter movement causes the disc 17 to assume a rest or temporarily stopped metering position during idle metering periods or times when there is no power consumption, false toggling of the flip-flops will not occur. For example, if the edge 54 of the surface 30A is stopped immediately under the sensing unit 33 and then creeping or osciallating movement of the disc 17 occurs, the circuit disclosed herein will not produce repetitive pulses at the output channels. This is prevented due to the electronic detenting operation of the pulse initiating circuit and therefore there is no need to provide a mechanical detent for the meter disc and shaft. The initial positioning of the leading end 54 of the surface 30A can only produce a single toggle action at the flip-flop 150 and as the end then moves backward away from the sensing unit, there will be no change in the outputs of the flip-flop 150 since it remains in the bistable circuit condition. When the end 54 returns to beneath the sensing unit 33, as it would in an osciallating or creeping movement, the flip-flop 150 will not respond to the impulses applied to the J input and to the clocked input since the flip-flop 150 will already have been toggled to the bistable condition established by these inputs.

The same detenting operations would occur if the leading end 56 of the surface 30B were to be stopped adjacent to the sensing unit 33. Similarly, if the surface ends 55 or 57 oscillate between the sensing unit 33, there will only be a repetition of resetting impulses at the flip-flop reset inputs and no repetitive change in the state of these flip-flops will occur. These inputs simply tend to return either flip-flop to the reset condition, which it will already be at, and therefore there will be no change at the first or second output pulse channels. Also, if it is desired to only produce pulses in response to one direction or rotation of the disc 17, it is apparent that this may be accomplished by connecting the recording or telemetry equipment to only one of the first or second output channels of the pulse indicating circuit.

Since numerous changes may be made in the above-described apparatus, and since different embodiments of the invention may be made without departing from the spirit thereof, it is intended that all of the matter contained in the foregoing description, or shown in the accompanying drawing, shall be interpreted as illustrative rather than limiting.

I claim as my invention:

1. A direction sensitive pulse initiator for an electrical meter having an electro-responsive meter movement including a rotating member which rotates in opposite directions and at a rate corresponding to the direction and amount of an electric power quantity to be measured by the electrical meter, said pulse initiator comprising:

a light reflecting pattern including first and second circularly arcuate surfaces disposed on the rotating member, said first of the reflecting surfaces extending along a first circular axis between first and second ends thereof, and said second of the reflecting surfaces extending along a second circular axis between first and second ends which are arcuately staggered relative to said first and second ends of said first surface and being positioned along a second arc, said second circular axis being concentric with said firstcircular axis and having a radius which is greater than the radius of the first circular axis;

first and second optical sensors mounted on said meter in alignment with said first and second circular axes, respectively, so as to separately detect the respective first and second reflecting surfaces when positioned adjacent the sensors, said first and second sensors being activated by the adjacent positioning of said first and second surfaces to produce first and second impulses;

said first and second sensors and said first and second relfecting surfaces being arranged with respect to each other such that rotation of the rotating member in one direction causes at least a portion of the first surface to pass adjacent the first sensor before any portion of the second surface passes adjacent the second sensor, and further such that rotation of the rotating member in the opposite direction causes at least a portion of the second surface to pass adjacent the second sensor before any portion of the first surface passes adjacent the first sensor;

a bistable circuit including first and second inputs connected to receive said first and second impulses from the sensors when the reflecting surfaces pass adjacent the sensors, said circuit being connected to establish opposite output states corresponding to said one and opposite directions of rotation and maintaining the associated output state when the direction of rotation remains the same; and output circuit means for producing output pulses at a rate corresponding to the rate of rotation of said rotating member, said output circuit means including an input connected to the bistable circuit so as to be responsive to the opposite output states, and further including first and second output channels selectively producing said output pulses in accordance with the opposite states of said bistable circuit, said first output channel providing the output pulses corresponding to the power quantity when occurring in one direction, and said second channel providing the output pulses corresponding to the power quantity when occurring in the opposite direction.

2. The initiator of claim 1, wherein the rotating member is a disc electromagnetically driven by magnetic fields of voltage and current coils connected to a power line conducting the power quantity to be measured.

3. The initiator of claim 1, wherein the first and second optical sensors each include photoemitting, photosensitive, and associated passive circuit elements arranged so that light is reflected from the reflecting surfaces and between the photoemitting and photosensing elements of each sensor.

4. The initiator of claim 1, wherein the bistable circuit includes a J-K flip-flop and said output circuit means includes first and second switching elements, with the first sensor connected to the J and clocked inputs of the flip-flop and the second sensor connected to the K and clocked inputs of the flip-flop, and with the Q output of the flip-flop being connected to the first switching element which is connected to produce the output pulses in the first channel, and the $\overline{Q}$ of the flip-flop being connected to the second switching element which is connected to produce the output pulses in the second output channel.

5. The initiator of claim 4, wherein the output circuit means comprises a third optical sensor including a photo-emitting element and a photosensitive element arranged to detect a second pattern of reflective surfaces disposed on the rotating member to reflect light between the photo-emitting and photosensitive elements of said third optical sensor when said rotating member is rotated to develop the output pulses.

6. The initiator of claim 1, wherein the bistable circuit includes the first named and a second J-K flip-flop each having J, K, reset and clocked inputs and Q and $\overline{Q}$ outputs, said J inputs of the first and second flip-flops being separately connected to the first and second sensors, said clocked inputs connected together and to the first and second sensors, and the bistable circuit further includes first and second logic gates with one input of each logic gate connected to a separate one of the first and second optical sensors and the output of each logic gate connected to a separate reset input of the first and second flip-flops and with a like output of each flip-flop connected to a separate and further input to each logic gate, whereby the outputs of the first and second flip-flops directly produce said output pulses in the first and second output channels, respectively.

* * * * *